United States Patent
Yang (12)

(10) Patent No.: US 6,232,215 B1
(45) Date of Patent: May 15, 2001

(54) METHOD FOR FORMING INCREASED DENSITY FOR INTERCONNECTION METALLIZATION

(75) Inventor: Ming-Tzong Yang, Hsinchu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 08/931,235

(22) Filed: Sep. 15, 1997

Related U.S. Application Data

(60) Provisional application No. 60/026,279, filed on Sep. 18, 1996.

(51) Int. Cl.[7] ................. H01L 21/4763; H01L 21/44
(52) U.S. Cl. ............. 438/622; 438/624; 438/636; 438/637; 438/666; 438/669; 438/687; 438/688
(58) Field of Search ................. 438/970, 622, 438/687, 688, 669, 623, 624, 637, 652, 666, 672, 636, 642, 643, 644, 618

(56) References Cited

U.S. PATENT DOCUMENTS 5,286,674    2/1994    Roth et al. ................ 438/624
5,656,543  * 8/1997    Chung ...................... 438/625

* cited by examiner

*Primary Examiner*—Charles Bowers
*Assistant Examiner*—Thanhha Pham
(74) *Attorney, Agent, or Firm*—Rabin & Champagne, PC

(57) ABSTRACT

A layer of metal is deposited on the surface of a layer of dielectric material and layer of protective material such as a thin layer of silicon oxide is provided on the layer of metal. An etch mask, which might be photoresist, is provided on the layer of protective material. The protective layer is etched through and the metal layer is etched using the photoresist etch mask. Little or no overetching is performed at this time, so it is likely that stringers from the metal layer will be left between the patterned wiring lines. Sidewall structures are then formed alongside the metal lines to protect the sidewalls of the wiring lines from undercutting and corrosion in subsequent etching steps. Overetching is then performed to remove any metal stringers, with the protective layer and the sidewall structures acting as masks for the overetching process, protecting the wiring lines from thinning during this etch process.

11 Claims, 5 Drawing Sheets

METHOD FOR FORMING INCREASED DENSITY FOR INTERCONNECTION METALLIZATION

This application claims priority from provisional application Ser. No. 60/026,279, filed Sep. 18, 1996.

Background of the Invention

1. Field of the Invention

The present invention relates to interconnections formed in integrated circuits having multiple levels of wiring lines.

2. Description of the Related Art

Modern integrated circuits include a high density of devices formed in and on a semiconductor substrate. Connections between devices are formed through conductors in and on the semiconductor substrate as well as through wiring lines formed from layers of metal deposited on insulators over the surface of the semiconductor substrate. For example, an integrated circuit may include connections between diffused regions within the semiconductor substrate and first level and second level metal wiring lines. Such multilevel interconnection schemes rely on the accurate placement of vertically extending conductors between the substrate and the first level wiring lines, between the first level wiring lines and the second level wiring lines, and between the substrate and the second level wiring lines.

FIGS. 1 and 2 illustrate a conventional scheme for forming interconnections between different levels of wiring lines. FIG. 1 illustrates in partial cross-section an interconnection between a first level wiring line 14 formed on an insulating layer 12 above substrate 10 and a second level wiring line. The first level wiring line 14 may be aluminum or an aluminum alloy and the wiring line 14 typically connects to the substrate at a remote location or to other interconnections or other wiring lines. In the integrated circuit, first level wiring lines 14 are covered by an interlevel insulator 16, which may be silicon oxide ($SiO_2$) formed by chemical vapor deposition (CVD oxide). Vias 18 are formed through the insulator 16 down to the first level wiring lines 14 by conventional photolithography and etching, and then vertically extending metal conductors 20 are formed within the vias to make electrical contact with the first level wiring lines 14. A second level of wiring is formed by depositing a layer of metal over the surface of the insulator 16 and patterning using conventional photolithography and etching to provide second level wiring lines 22. The vertically extending conductor 20 connects first level wiring lines 14 to second level wiring lines 22.

FIG. 2 is a plan view of the interconnection shown in FIG. 1, with the cross-section of FIG. 1 indicated in the FIG. 2 view by the line extending from 1 to 1' in FIG. 2. As can be seen in the plan view, the interconnection region provided for the first level wiring line 14 includes a contact pad 24, which is an oversized region larger in width than other portions of the first level wiring line 14. The larger size of the pad 24 reflects the provision of misalignment tolerances for possible misalignment of the via 18 with respect to the wiring line 14 in the photolithography process. If such an oversized pad region is not provided below the via 18, then there is an unacceptable possibility that the via will be positioned partially off of the first level wiring line 14 so that the via etch would remove some of the insulation or other material on which the first level wiring line is deposited. Providing such an oversized contact pad is undesirable, however, in that the larger width of a pad 24 prevents wiring lines from being spaced closely.

Still referring to FIG. 2, it can also be seen that the diameter of via 18 is typically smaller than the width of the second level wiring line 22 because the second level wiring line 22 must be sufficiently wide to provide misalignment tolerances for possible misalignment of the second level wiring line 22 with respect to the via 18. Making the second level wiring line wider than the via 18 by a sufficient amount to accommodate possible misalignments is similarly undesirable because the need to provide such misalignment tolerances makes it more difficult to increase the density of integrated circuits.

One conventional strategy adopted in response to this problem is to use tungsten to form the vertically extending conductor 20 shown in FIG. 1. The via 18 can be filled with tungsten using, for example, the selective deposition of tungsten. The subsequent step of patterning a deposited second metal layer to form second level wiring lines can be performed with much higher accuracy, greatly reducing the size of misalignment tolerances that must be provided, allowing the second level to be narrower than shown in FIG. 2. Such tungsten plug technology is, however, undesirable because of the expense and the difficulty of the process. In addition, tungsten plug technology still requires the provision of an enlarged contact pad to avoid etching the insulating layer under the first level wiring line that would occur if there were a via misalignment.

Another strategy suggested for improving conventional interconnection techniques is shown in FIG. 3, in which structures similar to those shown in FIGS. 1 and 2 are identified by the same identification numbers. In the FIG. 3 interconnect, insulating sidewall or spacer structures 26 are formed on either side of the first level wiring line 14, and no oversize contact pad region is provided. The insulating sidewall structures 26 are typically formed from silicon nitride or a similar material that etches more slowly than either the first insulating layer 12 on which the first level wiring line 14 is formed or the second insulating layer 16 formed over the first wiring line 14. Accordingly, if there is a misalignment of the mask used for etching the via 18 through the second insulating layer 16, the insulating layer 12 will not be etched if the misalignment is within the tolerance provided by the width of the insulating sidewall structures 26. The interconnection illustrated in FIG. 3 is desirable over the structure illustrated in FIG. 1 because the misalignment tolerance is provided by the insulating sidewall structures, so that first level metal wiring lines 14 can be spaced more closely without loss of reliability. There is, however, a tendency to produce undesirably resistive lower level wiring lines in the implementation of the FIG. 3 structure.

SUMMARY OF THE PREFERRED EMBODIMENTS

It is an object of the present invention to provide a system of conductors having different layers of wiring lines connected together through vertical interconnects. In some embodiments of the invention, etch stop structures are provided on either side of lower level wiring lines in the regions where vertical interconnects are to be formed to prevent the etching of underlying insulating regions if there is a misalignment of the interconnect via. A layer of protective material, preferably different from that used to form the etch stop structures, is provided on the surface of the lower level wiring lines to protect the lines from etching in the formation of the interconnect structure. In particularly preferred embodiments of the invention, the combination of the layer of protective material and the sidewall structures protect the lower level wiring lines during at least a portion of the wiring line etching process.

In accordance with a particular aspect of the present invention, a method of producing interconnects for a semiconductor device on a substrate forms a first dielectric layer having a surface and then forms first openings in the first dielectric layer. A first layer of conductive material is deposited over the surface of the first dielectric layer to extend into the first openings. A first layer of protective material is deposited over the first layer of conductive material. A pattern of first interconnect wirings is formed from the first layer of conductive material, the patterned first layer of protective material covering an upper surface of the patterned first layer of conductive material. A first layer of sidewall material is deposited over the patterned first layer of conductive material and then the first layer of sidewall material is etched back to form first sidewalls alongside the first interconnect wirings so that the first sidewalls and the patterned first layer of protective material cover surfaces of the patterned first layer of conductive material to protect the first layer of conductive material during subsequent processing.

DETAILED DESCRIPTION OF THE PREFERRED EMBODIMENTS

Figure 1:
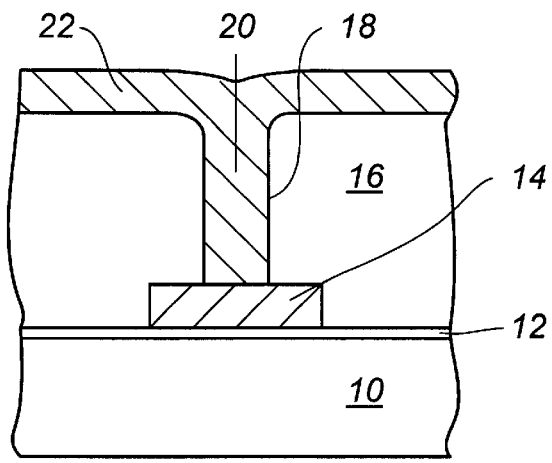
FIGS. 1–2 illustrate a conventional interconnect structure using an oversized landing pad structure to provide for misalignment tolerances.
Figure 2:
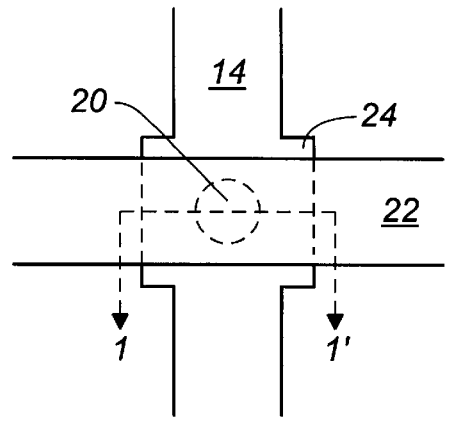
Figure 3:
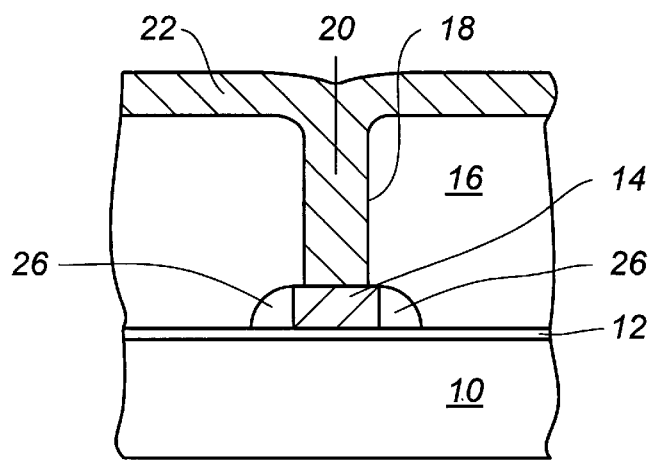
FIG. 3 illustrates a conventional interconnect structure using insulating sidewall structures to provide for misalignment tolerances.

The interconnect structure illustrated in FIG. 3 provides sidewall structures 26 to allow for possible misalignments in the via etching process. The sidewall structures provide misalignment tolerances without limiting how closely adjacent metal lines can be formed. The processes conventionally used in forming the FIG. 3 structure, however, have undesirable aspects which can lead to loss of metal from the wiring being contacted. Conventionally, the metal wiring lines of the FIG. 3 structure are patterned in a process that can result in significant levels of metal loss, particularly in the process of overetching to remove stringers formed over uneven topography on the surface of the insulating layer 16.

An aspect of the present invention reduces metal line thinning during overetching processes without increasing the likelihood that metal stringers will be left behind that could short adjacent wiring lines. According to this aspect of the invention, a layer of metal is deposited on the surface of a layer of dielectric material. A layer of protective material such as a thin layer of silicon oxide is provided on the layer of metal. An etch mask, which might be photoresist, is provided on the layer of protective material. The protective layer is etched through and the metal layer is etched using the photoresist etch mask. Little or no overetching is performed at this time, so it is likely that stringers from the metal layer will be left between the patterned wiring lines. Sidewall structures are then formed alongside the metal lines to protect the sidewalls of the wiring lines from undercutting and corrosion in subsequent etching steps. Overetching is then performed to remove any metal stringers, with the protective layer and the sidewall structures acting as masks for the overetching process, protecting the wiring lines from thinning during this etch process.

Preferred embodiments of the present invention form an interconnect by depositing a first layer of metal on a first dielectric layer and then providing a thin layer of silicon oxide on the surface of the metal layer. This thin silicon oxide layer will protect the first metal layer during subsequent processing steps, including wiring line definition. The thin silicon oxide layer and the first metal layer are patterned using conventional photolithographic techniques. A layer of sidewall material such as silicon nitride is then deposited and sidewall structures are formed alongside the first layer metal wiring lines. A second dielectric layer is then deposited. A via to the first layer metal wiring lines is formed by etching the second dielectric layer, with the sidewall structures acting as an etch stop for the via etch. A second layer of metal is deposited and patterned to form second layer metal wiring lines, with a second layer wiring line extending through the via into contact with a first layer wiring line.

Other aspects and further details of the present invention are now described with reference to FIGS. 4–12. These figures illustrate embodiments of the present invention that provide two levels of metal wiring lines. More or less complicated interconnect structures and interconnected structures which have a greater or lesser number of layers are of course possible. The illustrated embodiments might be utilized in a variety of semiconductor devices, including both memory devices and logic devices.

Figure 4:
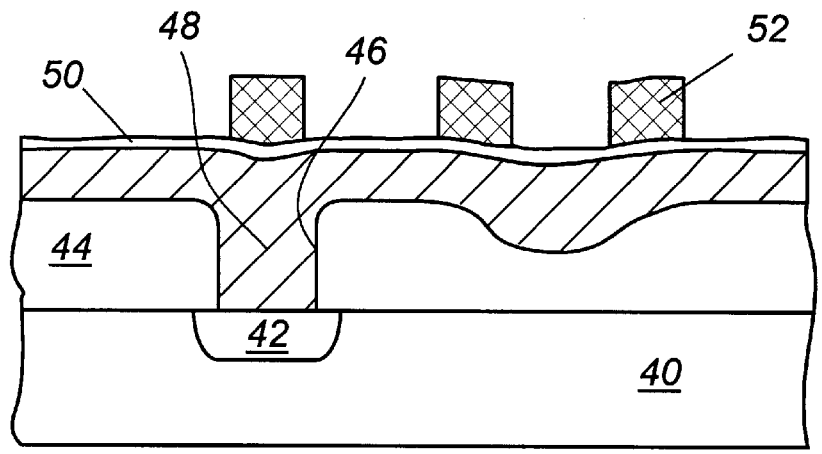
FIGS. 4–12 illustrate steps in a process according to the present invention in which a two level interconnect structure.

FIG. 4 shows, in schematic cross-section, a small portion of a semiconductor device at a relatively late stage of processing. Structures and circuits of the semiconductor device are provided in and on a substrate 40, and the device has one or more heavily doped contact regions 42. A layer of dielectric material 44 such as silicon oxide or a doped silicon oxide is formed by chemical vapor deposition, for example, from a source gas such as TEOS. A via 46 is formed in the conventional manner by forming a contact mask and etching through the dielectric layer 44 to expose the surface of N+ doped contact region 42. A first layer of metal 48 such as aluminum or an alloy of aluminum is deposited by sputtering over the surface of dielectric layer 44 and into via 46 to make electrical contact with the contact region 42. Variations on this particular combination of structures are possible, including for example, provision of a barrier layer between the metal layer 48 and contact region 42 or use of other metals or conductors for layer 48.

A layer of protective material 50 is then formed on the surface of metal layer 48. This layer of protective material serves various purposes. Since the layer 50 preferably remains on the surface of the metal lines 48 after the etching process that forms the sidewall structures, it is preferred that layer 50 be different from the material used to form the sidewall structures. Nevertheless, many of the advantages of the invention can be realized if layer 50 is formed from the same material as the sidewall structures. It is desirable for the layer 50 to protect the metal layer during metal etch and overetch. Accordingly, layer 50 is preferably chosen so that layer 50 is at most lightly etched by metal etch chemistries. A suitable material for protective layer 50 may be silicon oxide, which does not readily etch in chlorine-based plasma etch chemistries of the sort often used for etching metals. Additionally, a silicon oxide layer 50 is compatible with the formation and use of silicon nitride sidewall structures. It will, of course, be appreciated that other materials could be used for layer 50, including silicon nitride. Appropriate other materials are preferably chosen to have the above-discussed characteristics with respect to the other materials used in the interconnect structure discussed above.

Thus, CVD silicon oxide or another type of silicon oxide may be used as the layer 50.

Figure 5:
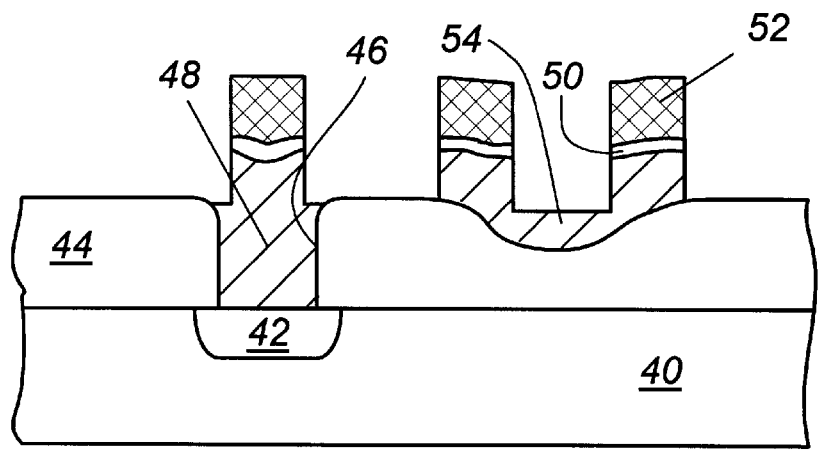

Next, a photoresist mask 52 is formed on layer 50 over portions of metal layer 48 which are to be formed into wiring lines. The oxide layer 50 may be etched using, for example, RIE and a gas mixture consisting of $CHF_3$, $O_2$ and Ar. Metal layer 48 is then etched to produce the structure shown in FIG. 5. As indicated in FIG. 5, it is preferred that the metal etch extend through the nominal thickness of the first metal layer 48 down to the first dielectric layer 44, with little or no overetching at this time. Without overetching, it is expected that metal stringers 54 will be left on the surface of the first dielectric layer 44, particularly where the first dielectric layer has an uneven surface. Thus, a metal stringer is formed from the first metal layer 48 and on uneven portions of the surface of the first dielectric layer 44. The metal stringer conductively couples at least two of the first interconnect wirings together. This operation further removes essentially all of the first metal layer from between at least two other first interconnect wirings to electrically isolate the two other first interconnect wirings from each other.

Figure 6:
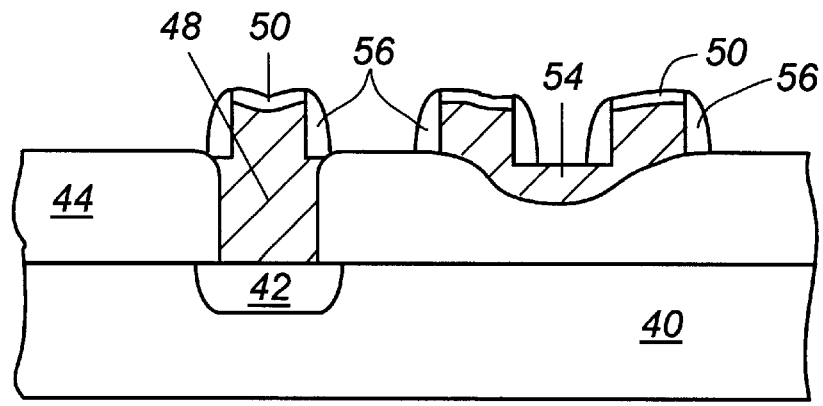
Figure 7:
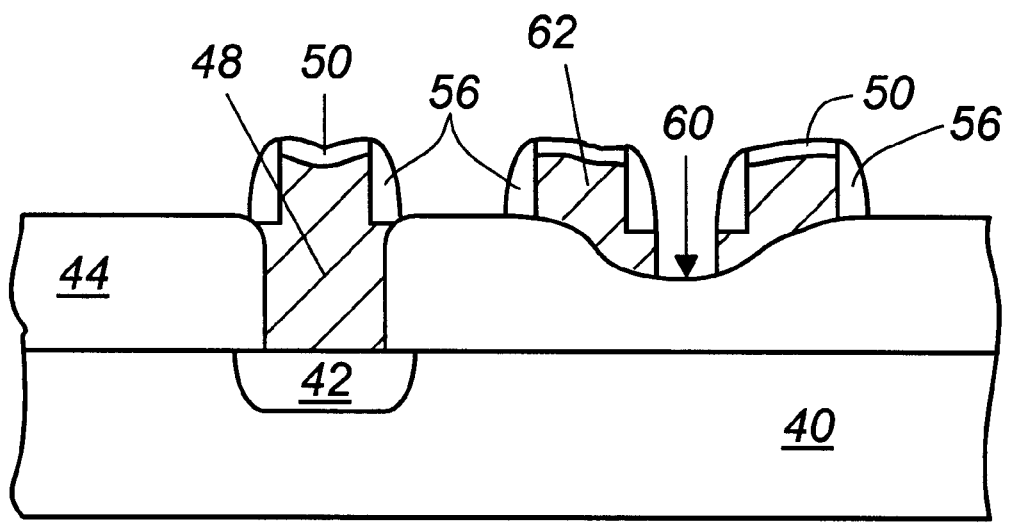

The photoresist mask 52 is removed by ashing and then the sidewall structures 56 are formed (FIG. 6). It is preferred that the material of the sidewall structures function as an etch stop in the subsequent via etch process to prevent the via etch from extending into the first dielectric layer 44. Thus, it is preferred that the material used for forming the sidewall structures 56 be different both from the first dielectric layer 44 and the second dielectric layer to be formed over the first level wiring lines. It is preferred that, for at least some etch chemistry, the sidewall material etch more slowly than both the first dielectric layer 44 and the second dielectric layer. It is also desirable that the sidewall structure not be etched by typical metal etch chemistries. Silicon oxide and silicon nitride are preferred materials for the sidewall structures 56 so that, for devices in which silicon oxide is used as the dielectric layer 44, it is preferred to use silicon nitride as a sidewall material. The width of the sidewall structures 56, which determines the amount of alignment tolerance provided by the sidewall structures on either side of wiring line 14 for the via etch process, is determined by the thickness of the silicon nitride layer deposited. Silicon nitride is thus deposited by CVD or another deposition process over the surface of the silicon oxide protective layers 50 and over the silicon oxide layer 44 to a thickness equal to the desired alignment tolerance. An RIE etch back process is then performed using an etch chemistry consisting of $SF_6$, He and $O_2$ to form the sidewall structures 56.

Overetching of the first metal layer 48 can now be performed using the silicon oxide protective layers 50 and the silicon nitride sidewall structures 56 to protect the metal wiring lines. Because the metal wiring lines are protected from the overetch etchants, the overetching process can be continued for a longer period of time without thinning or otherwise damaging the metal lines. The overetching process can thus be performed using the surface of silicon oxide dielectric layer 44 as an etch stop, allowing ample etching time to ensure that all excess metal from layer 48 is removed. By providing protective layers over most of the surface of first level metal lines 48, the duration of the metal overetching process is not a critical parameter, with the result that the first level wiring lines 48 can be more reliably manufactured.

Figure 8:
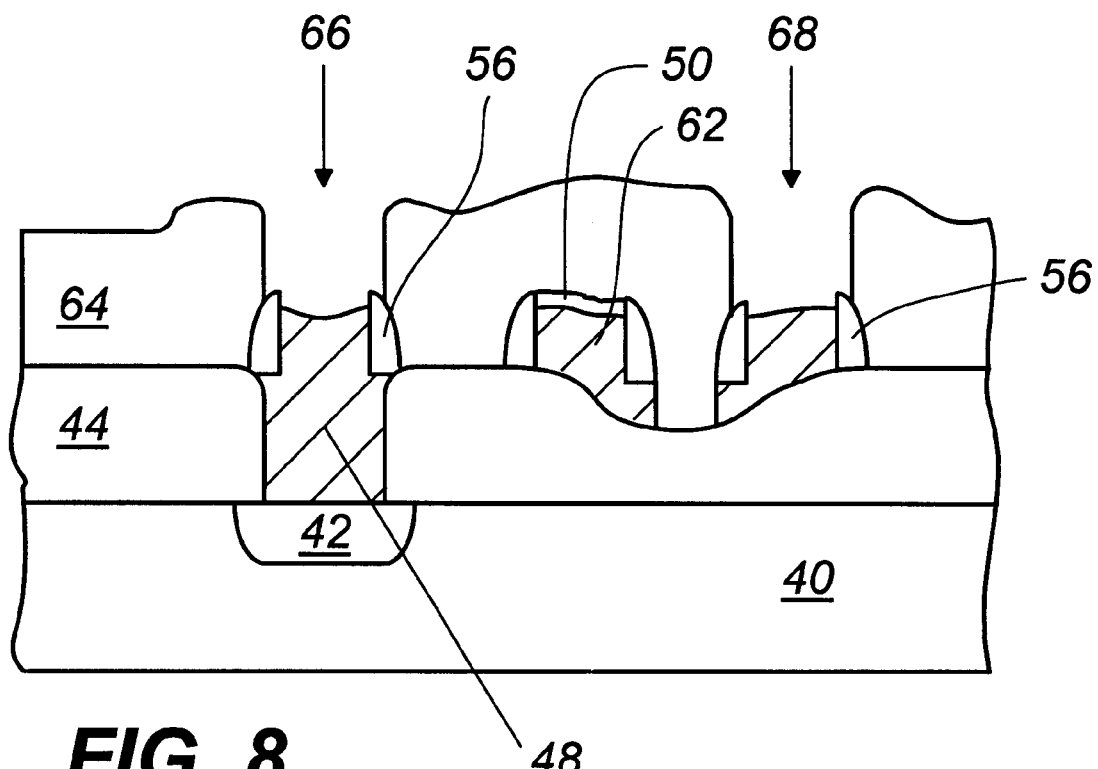
Figure 9:
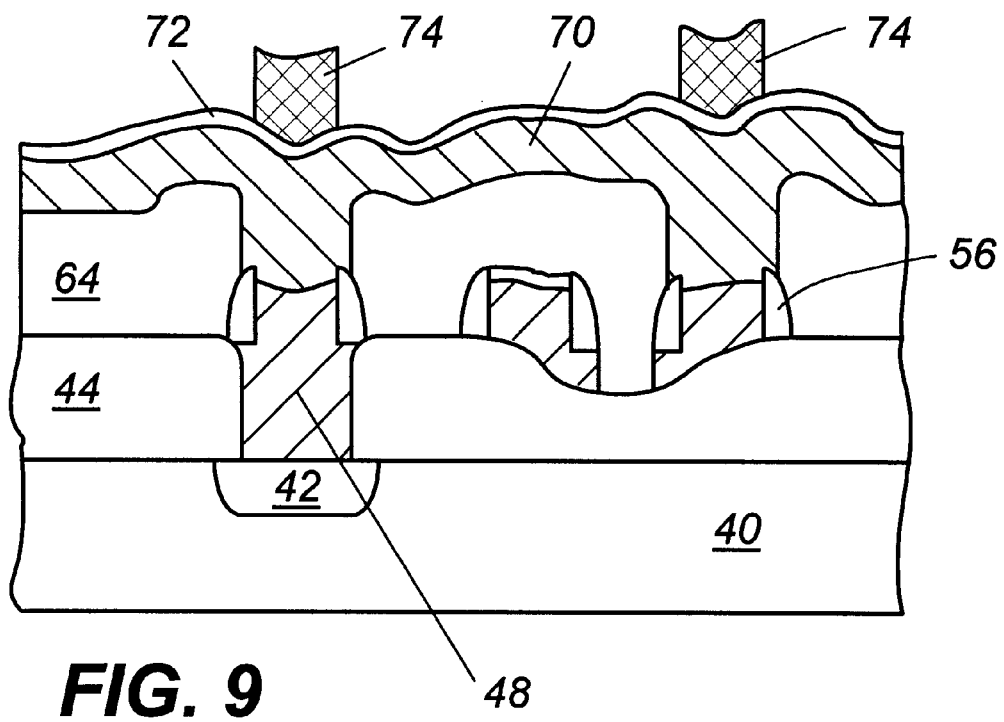
Figure 10:
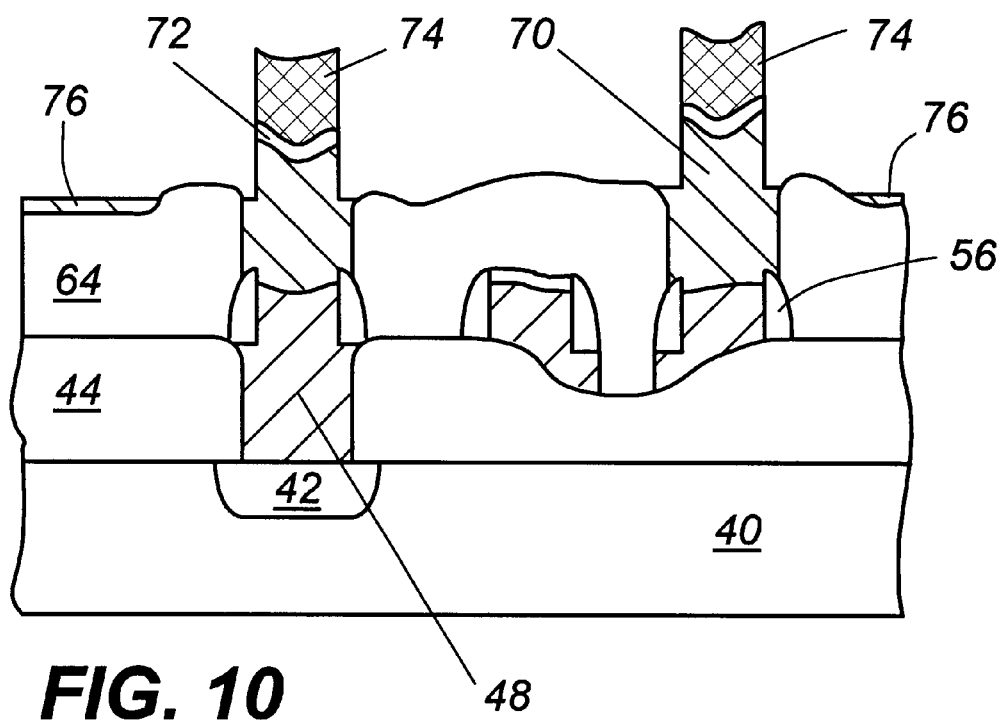

The first level of wiring lines includes a vertical interconnect structure 60 that extends from the surface of contact region 42 to the surface of the first dielectric layer 44 which may or may not extend along the surface of the first dielectric layer 44. The first level of wiring lines also includes interconnects 62 that run along the surface of the first dielectric layer 44 and which may or may not make contact with a remotely situated portion of the substrate. A second dielectric layer 64 of, for example, CVD silicon oxide is formed over the device, as shown in FIG. 8. Vias 66, 68 are etched through the second dielectric layer 64 using, for example, RIE and a gas mixture consisting of $CHF_3$, $O_2$ and Ar to expose the surfaces of the vertical interconnect 60 and the wiring line 62. This via etching process preferably uses the sidewall structures 56 as etch stops. The protective layers 50 are preferably removed in this step, which is easily accomplished when the protective layer 50 and the dielectric layer 64 are both silicon oxide. A second layer of metal 70 such as aluminum or an alloy of aluminum is deposited by sputtering over the surface of the second dielectric layer 64 and into the vias 66, 68 (FIG. 9).

Figure 11:
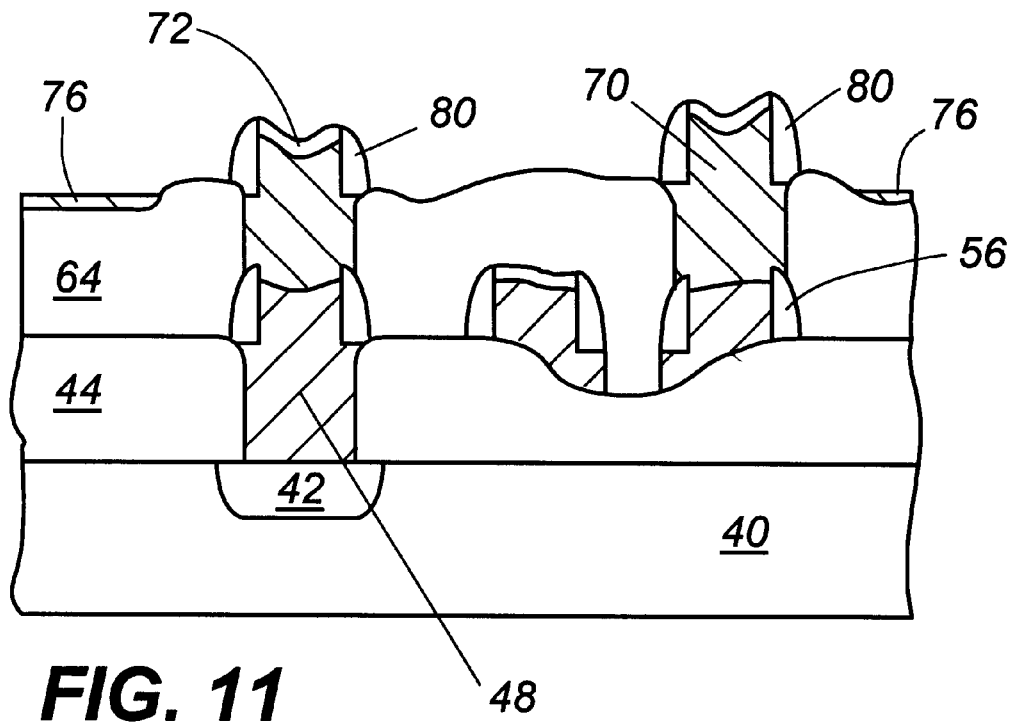
Figure 12:
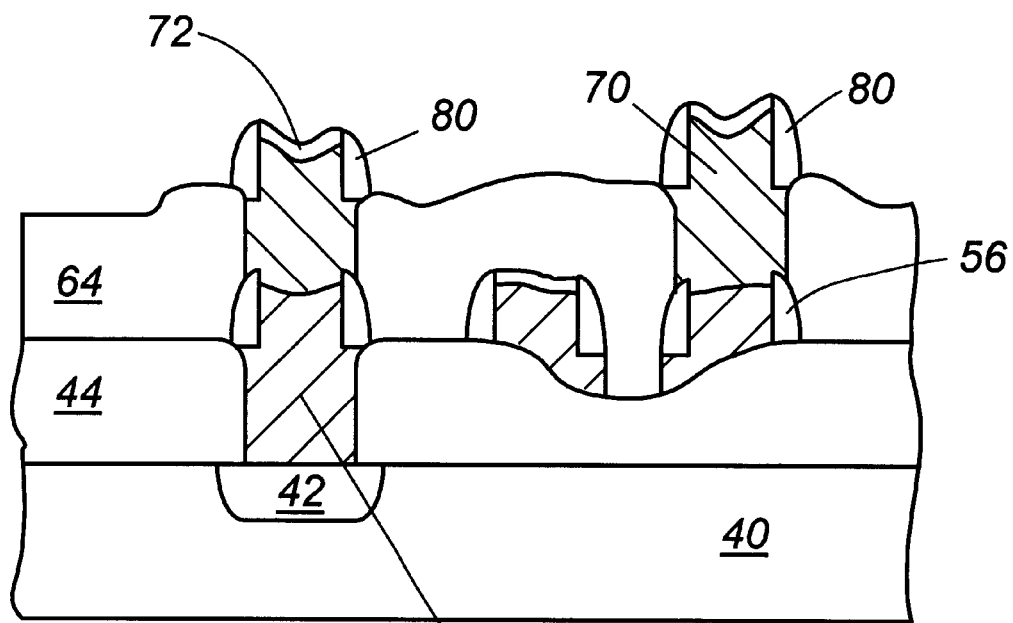

A second metal layer of protective material 72, which may also be silicon oxide, is then formed on the surface of the second metal layer 70. Next, a photoresist mask 74 is formed on layer 72 over portions of the second metal layer 70 which are to be formed into wiring lines. The oxide layer 72 is etched using, for example, RIE and a gas mixture consisting of $CHF_3$, $O_2$ and Ar. Metal layer 70 is then etched to produce the structure shown in FIG. 10. As before, it is preferred that the etch extend through the nominal thickness of the second metal layer 70 down to the second dielectric layer 64, with little or no overetching. As before, it is likely that stringers 76 consisting of metal residue will be left on the surface of the insulating layer 64 when overetching is not performed. The photoresist mask 74 is removed by ashing and then the sidewall structures 80 are formed (FIG. 11). It is again preferred that, in any subsequent via etch process that might be performed, the material of the sidewall structures 80 function as an etch stop to prevent the via etch from extending into the second dielectric layer 64. Silicon nitride is deposited by CVD, or other deposition process, over the surface of the silicon oxide protective layers 72 and over the silicon oxide layer 64 to a thickness equal to the desired alignment tolerance. An RIE etch back process is then performed using an etch chemistry consisting of $SF_6$, He and $O_2$ to form the sidewall structures 80. Overetching of the second metal layer 70 can then be performed using the silicon oxide protective layers 72 and the silicon nitride sidewall structures 76 to protect the metal wiring lines during etching. Further processing is performed to complete the device. It should be noted that aspects of the present invention can be used to advantage when applied to upper level wiring lines, even when additional layers of wiring lines are not formed.

While the present invention has been described in terms of certain preferred embodiments, those of ordinary skill will appreciate that various modifications and alterations to the embodiments described herein might be made without altering the basic function of the present invention. Accordingly, the scope of the present invention is not limited to the particular embodiments described herein; rather, the scope of the present invention is to be determined from the following claims.

What is claimed:

1. A method of producing interconnects for a semiconductor device on a substrate, comprising the steps of:

forming a first dielectric layer, having an uneven surface, on a substrate;

forming first openings in the first dielectric layer;

depositing a first layer of conductive material over the surface of the first dielectric layer and extending into the first openings;

depositing a first layer of protective material over the first layer of conductive material;

forming a pattern of first interconnect wirings from the first layer of conductive material, the patterned first layer of protective material covering an upper surface of the patterned first layer of conductive material, said forming causing a metal stringer to be formed from the first layer of conductive material and on uneven portions of the surface of the first dielectric layer, said metal stringer conductively coupling at least two first interconnect wirings together, said forming further removing essentially all of the first layer of conductive material from between at least two other first interconnect wirings to electrically isolate the two other first interconnect wirings from each other; and depositing a first layer of sidewall material over the patterned first layer of conductive material and then etching back the first layer of sidewall material to form first sidewalls alongside the first interconnect wirings so that the first sidewalls and the patterned first layer of protective material cover surfaces of the patterned first layer of conductive material to protect the first layer of conductive material during subsequent processing.

2. The method of claim 1, wherein the first layer of conductive material comprises a metal, the first layer of protective material is a first insulator, and the first layer of sidewall material is a second insulator.

3. The method of claim 2, wherein the first and second insulator are different materials.

4. The method of claim 2, wherein the first layer of conductive material makes electrical contact with a doped region within the substrate.

5. The method of claim 1, further comprising the step, after formation of the first sidewalls, of overetching to remove the metal stringer of the first layer of conductive material from the surface of the first dielectric layer.

6. The method of claim 1, further comprising the steps of:

depositing a second dielectric layer over the first dielectric layer and over the first sidewalls and over the patterned first layer of conductive material; and etching second openings in the second dielectric layer aligned with portions of the first interconnect wirings.

7. The method of claim 6, wherein the step of etching the second openings uses at least one of the first sidewalls as an etch stop so that an adjacent portion of the first layer of protective material is etched below an adjacent portion of the at least one of the first sidewalls.

8. The method of claim 6, wherein the second dielectric layer is etched more rapidly than exposed portions of the first sidewalls in the step of etching the second openings.

9. The method of claim 6, further comprising the step of removing the patterned first layer of protective material from portions of the upper surface of the patterned first layer of conductive material.

10. The method of claim 6, further comprising the steps of:

depositing a layer of metal over a surface of the second dielectric layer and extending into the second openings;

depositing a second layer of protective material over the layer of metal;

forming a pattern of second interconnect wirings from the layer of metal, the patterned second layer of protective material covering an upper surface of the patterned layer of metal; and depositing a second layer of sidewall material over the patterned layer of metal material and then etching back the second layer of sidewall material to form second sidewalls alongside the second interconnect wirings so that the second sidewalls and the patterned second layer of protective material cover surfaces of the patterned layer of metal to protect the patterned layer of metal during subsequent processing.

11. The method of claim 10, further comprising the step, after formation of the second sidewalls, of overetching to remove residual portions of the layer of metal from the surface of the second dielectric layer.

* * * * *